US008788990B2

(12) United States Patent
Meserve

(10) Patent No.: US 8,788,990 B2
(45) Date of Patent: Jul. 22, 2014

(54) REUSE OF CIRCUIT LABELS IN SUBCIRCUIT RECOGNITION

(75) Inventor: Douglas C. Meserve, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 741 days.

(21) Appl. No.: 12/604,368

(22) Filed: Oct. 22, 2009

(65) Prior Publication Data

US 2010/0042964 A1  Feb. 18, 2010

Related U.S. Application Data

(63) Continuation-in-part of application No. 12/035,405, filed on Feb. 21, 2008, now Pat. No. 7,861,193.

(51) Int. Cl.
*G06F 17/50* (2006.01)

(52) U.S. Cl.
USPC ........... 716/103; 716/100; 716/105; 716/106; 716/107; 716/119; 716/124; 716/136

(58) Field of Classification Search
USPC ......... 716/100, 103, 105, 106, 107, 119, 124, 716/136
See application file for complete search history.

(56) References Cited

U.S. PATENT DOCUMENTS

| | | | |
|---|---|---|---|
| 6,536,018 B1 * | 3/2003 | Chisholm et al. | 716/136 |
| 7,047,506 B2 * | 5/2006 | Neves et al. | 716/113 |
| 7,739,646 B2 * | 6/2010 | Lin et al. | 716/119 |
| 7,937,678 B2 * | 5/2011 | Lippmann et al. | 716/103 |
| 7,958,468 B2 * | 6/2011 | Meserve | 716/100 |
| 8,051,395 B2 * | 11/2011 | Sourjko et al. | 716/100 |
| 2007/0256037 A1 * | 11/2007 | Zavadsky et al. | 716/2 |
| 2009/0158235 A1 * | 6/2009 | Ghica | 716/18 |

OTHER PUBLICATIONS

Ganesan et al.; "Library finding for high-level synthesis of analog systems"; Publication Year: 2001; VLSI Design, 2001. Fourteenth International Conference on; pp. 261-268.*
Lei Yang et al.; "Frosty: a fast hierarchy extractor for industrial CMOS circuits"; Publication Year: 2003; Computer Aided Design, 2003. ICCAD-2003. International Conference on; pp. 741-746.*

* cited by examiner

*Primary Examiner* — Helen Rossoshek
(74) *Attorney, Agent, or Firm* — Martine Penilla Group, LLP

(57) ABSTRACT

Method, apparatus and system for finding instances of a pattern in a main netlist include reading in the main netlist and the pattern that is used for finding pattern matches in the main netlist. The main netlist and the pattern include a plurality of vertices. Each of the vertices is a device or a net. Labels for the vertices are computed in both the pattern and the main netlist up to a depth appropriate for the pattern. A vertex of the pattern is identified and used in matching with one or more vertices in the main netlist at the depth appropriate for the pattern using the computed labels. The computed labels for each of the vertices of the main netlist are stored for possible reuse in subsequent pattern matches.

11 Claims, 14 Drawing Sheets

REUSE OF CIRCUIT LABELS IN SUBCIRCUIT RECOGNITION

CLAIM OF PRIORITY

This application is a continuation-in-part of and claims priority to application Ser. No. 12/035,405 filed on Feb. 21, 2008, and entitled "REUSE OF CIRCUIT LABELS FOR VERIFICATION OF CIRCUIT RECOGNITION," which is incorporated herein by reference for all purposes.

CROSS REFERENCE TO RELATED APPLICATIONS

This Application is related to co-pending U.S. patent application Ser. No. 12/035,409, filed on Feb. 21, 2008, entitled "UNIDIRECTIONAL RELABELING FOR SUBCIRCUIT RECOGNITION," which is incorporated herein by reference for all purposes.

FIELD OF INVENTION

The present invention generally relates to electronic circuit design. More particularly, the present invention is directed to efficiently and accurately finding predetermined patterns in a main circuit design.

BACKGROUND

The present invention generally relates to electronic circuit design. More particularly, the present invention is directed to efficiently and accurately finding predetermined patterns in a main circuit design.

Recognizing or finding subcircuit instances in a larger circuit is widely used in the simulation, verification, and testing of integrated circuits using computer-aided design programs. Currently, the process of finding is performed using ad hoc techniques that rely on the circuit technology and implementation details. Such techniques, however, do not generalize to different subcircuit structures and do not transfer to other technologies. A publication entitled "SubGemini: Identifying SubCircuits using a Fast subgraph Isomorphism Algorithm," by Ohlrich, et. al. (hereinafter "SubGemini") describes a technology independent algorithm for solving this problem based on a solution to the subgraph isomorphism problem. This publication is incorporated herein by reference. SubGemini describes a use of a recursive relabeling approach to identify circuit patterns in a larger circuit. However, the SubGemini method of finding patterns in a larger circuit discards much of the information available in the labeling data, resulting in substantial inefficiencies.

Thus, there is a need for method and system that enable a more accurate and efficient identification of patterns (i.e., subcircuits) in a larger circuit.

SUMMARY OF THE INVENTION

An accurate and efficient method and system of detecting all instances of a subcircuit in a larger circuit are disclosed. Embodiments of the present invention disclose method, apparatus and system for reusing labels computed for the larger circuit in finding multiple subcircuit matches in the larger circuit. The labels include enough information related to the circuit topology around them.

In one embodiment, a method for matching a pattern (sub-circuit) in a main netlist is disclosed. The method includes reading in the main netlist and reading in a pattern for finding pattern matches in the main netlist. The main netlist and the pattern include a plurality of vertices. A vertex is a device or a net. The method further includes computing labels for each of the vertices in both the main netlist and the pattern up to a depth appropriate for the given pattern. A vertex of the pattern is matched with one or more vertices of the main netlist using the computed labels. The computed labels for each of the vertices of the main netlist are stored for possible reuse in subsequent pattern matches.

As more and more patterns are received for finding matches in the main netlist, additional labels may be computed based on the patterns, and added to the pool of labels for the main netlist. Some of the labels already computed in the main netlist may be reused during subsequent pattern matching process resulting in substantial saving of work to be performed during pattern-matching process thereby increasing the efficiency of the overall pattern-matching process.

In another embodiment, a computer readable medium having program instructions for matching a pattern in a main netlist is disclosed. Accordingly, the computer readable medium includes program instructions for reading in a main netlist and a pattern. The pattern is used for finding matches in the main netlist. The main netlist and the pattern include a plurality of vertices. Each vertex in the main netlist and the pattern is a net or a device. The computer readable medium further includes program instructions for computing labels for each of the vertices in both the main netlist and the pattern up to a depth appropriate for the given pattern. The computer readable medium also includes program instructions for matching a vertex of the pattern with one or more vertices of the main netlist using the computed labels and program instructions for storing the computed labels for each of the vertices of the main netlist so that the labels can possibly be reused in subsequent pattern matches.

In yet another embodiment, a system for matching a pattern in a main netlist is disclosed. The system includes a processor for executing program instructions, a memory to provide program instructions execution support to the processor; and a pattern matching module to retrieve data representing the main netlist and the pattern including data associated with a plurality of vertices, wherein each of the vertices in the main netlist and the pattern is a net or a device. The pattern matching module is also used to compute labels for each of the vertices in both the main netlist and the pattern up to a depth appropriate for the pattern and to match a vertex of the pattern with one or more vertices of the main netlist using the computed labels. The pattern matching module stores the computed labels for the main netlist so that the labels can possibly be reused for matching subsequent patterns.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention can be best understood by reference to the following description taken in conjunction with the accompanying figures, in which like parts may be referred to by like numerals.

Figure 1:
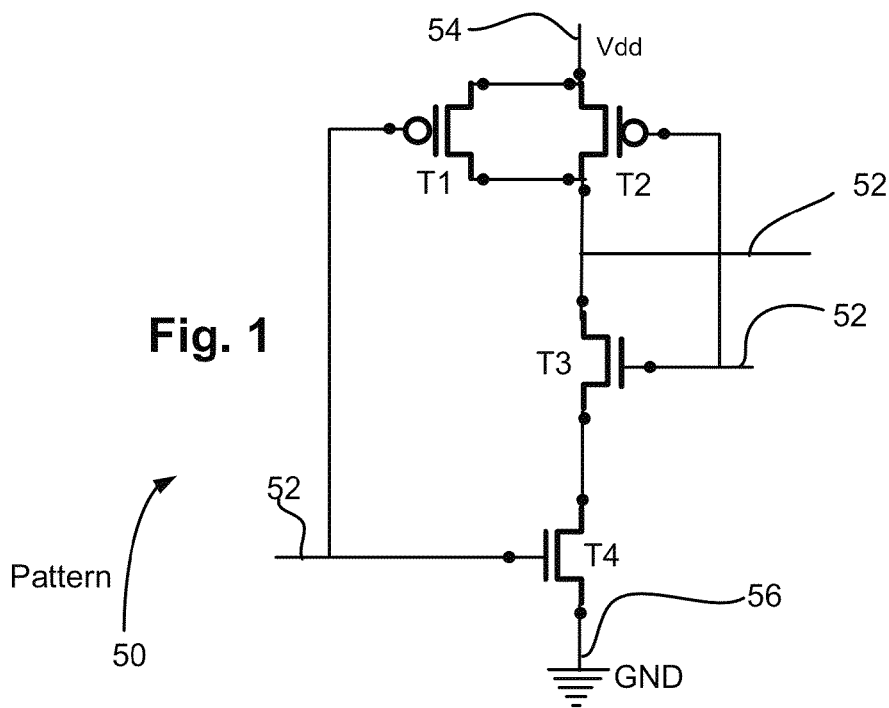
FIG. 1 illustrates an exemplary logic gate circuit (i.e., pattern), in accordance with one embodiment of the present invention.

The figures are provided in order to provide a thorough understanding of the present invention. The figures should not be construed as limiting the breath of the invention in any manner.

DETAILED DESCRIPTION OF THE INVENTION

A method of accurately identifying instances of a pattern (i.e., a smaller circuit or a subcircuit) in a larger circuit (i.e., a main netlist) is disclosed. In one embodiment, the circuit components of the pattern and the main netlist are unidirectionally relabeled recursively until no more relabeling is possible under given rules of relabeling. The highest label in the pattern is then used to identify the instances of the pattern in the main netlist. While the present invention has been particularly shown and described with reference to the foregoing preferred embodiments, those skilled in the art will understand that many variations may be made therein without departing from the spirit and scope of the invention as defined in the following claims. The scope of the invention should therefore, not be limited to the description of the invention; rather, the scope of the invention should be defined by the claims including the full scope of equivalents thereof.

The pattern, as used herein, is a circuit whose various properties and behavior are already known. For example, a NAND gate could be a pattern. The pattern has one or more devices such as transistors connected together through nets (for example, wires connecting the transistors in a logic gate). The nets may include resistors, capacitors, etc. However, for the purpose of the identification of the instances of the pattern in a larger circuit, i.e., main netlist, the nets are considered simple wire connections (i.e., circuit components such as resistors, capacitors, etc. are omitted and replaced by wire connections). One of the uses for finding the instances of a particular pattern in a main netlist is to identify a related collection of interconnected primitive devices in a circuit as a single high-level component. For example, converting a transistor netlist into a logic gate netlist involves finding the subcircuits representing gates and replacing them with the corresponding logic gates. Similarly, replacing larger known subcircuits such as flip-flops in a main netlist by "black boxes" would reduce simulation and analyzing time because the properties and characteristics of the flip-flop, for instance, are already known and do not need to be analyzed for every instance of this subcircuit in the main netlist.

Below we describe the technique of matching patterns in a circuit in two different parts. Part I deals with generating circuit labels for each vertex of a circuit having a plurality of vertices and reusing the generated circuit labels for matching a given pattern. Part II describes the process by which the same circuit labels generated for the main netlist are used when finding matches of any number of patterns in the main netlist.

Part I. Label Computation and Reuse for One Pattern:

In one embodiment, the process of identifying the instances of a pattern in the main netlist is performed in two phases. In the first phase, each net and device in the pattern and the main netlist is given an initial unique label. In this embodiment, the initial labels are prime numbers to minimize the possibility of number collision during recursive relabeling. Then, the nets and devices are relabeled recursively using a predefined formula (discussed in detail later in this document) for relabeling. The netlist is treated as a "graph," where both nets and devices are treated as the vertices, and the connection among the nets and devices are called "edges". This graph happens to be bipartite with the nets and devices as the two sets, i.e., all immediate neighbors of a net are devices, and all immediate neighbors of a device are nets.

In general, this process of relabeling transmits topology information laterally across the graph. The topology information is encoded in the vertex labels. That is, the information about a given vertex emanates outward by one step for each relabeling round. Conversely, with each relabeling round or iteration, the label of a given vertex encompasses topology information of a wider and wider area surrounding it. This transmission of information thus becomes an excellent way to encode a great deal of information about the pattern into a single vertex label. With labels that are the products of many relabeling iterations, it becomes very likely that the same labels appearing in the pattern and main netlist correspond to the same topologies in the surrounding area represented by that label. With this overview in mind, the following figures will illustrate example structure and functionality of sampling based runtime optimizer for efficient debugging of applications.

Figure 2:
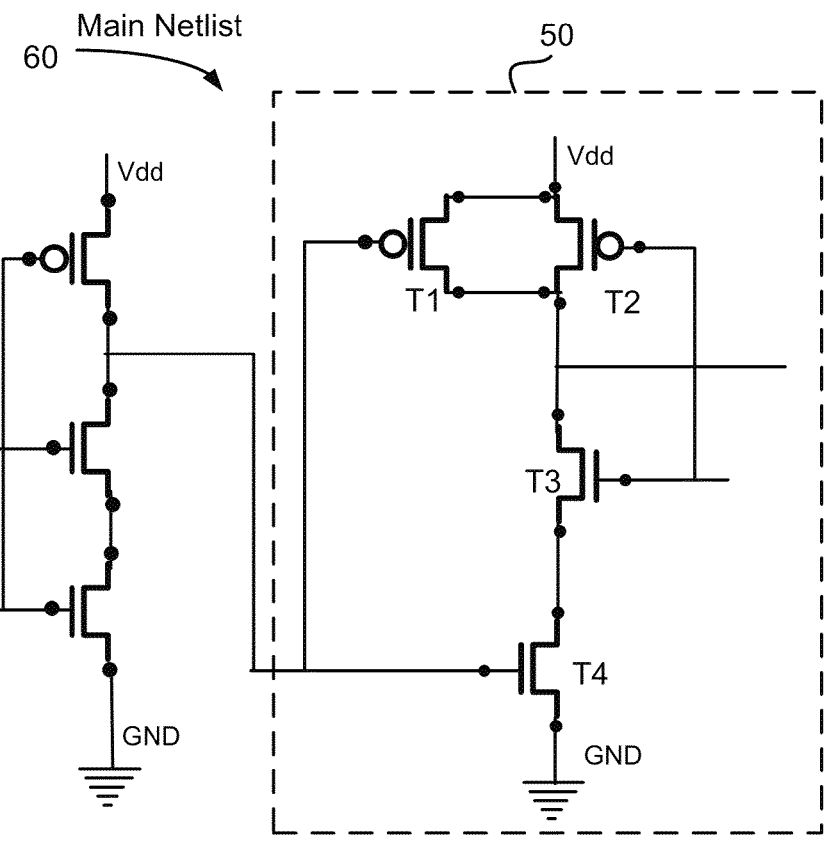
FIG. 2 illustrates an exemplary larger circuit (i.e., main netlist) that includes the pattern, in accordance with one embodiment of the present invention

FIG. 1 illustrates a transistor level representation of an exemplary circuit that will be used as a pattern 50. The pattern includes transistors T1, T2, T3, and T4 connected together through nets or wires. The pattern 50 contains a ground connection 56, a Vdd connection 54, and three I/O connections 52. FIG. 2 illustrates an exemplary main netlist 60 that includes one instance of the pattern 50.

Figure 3A:
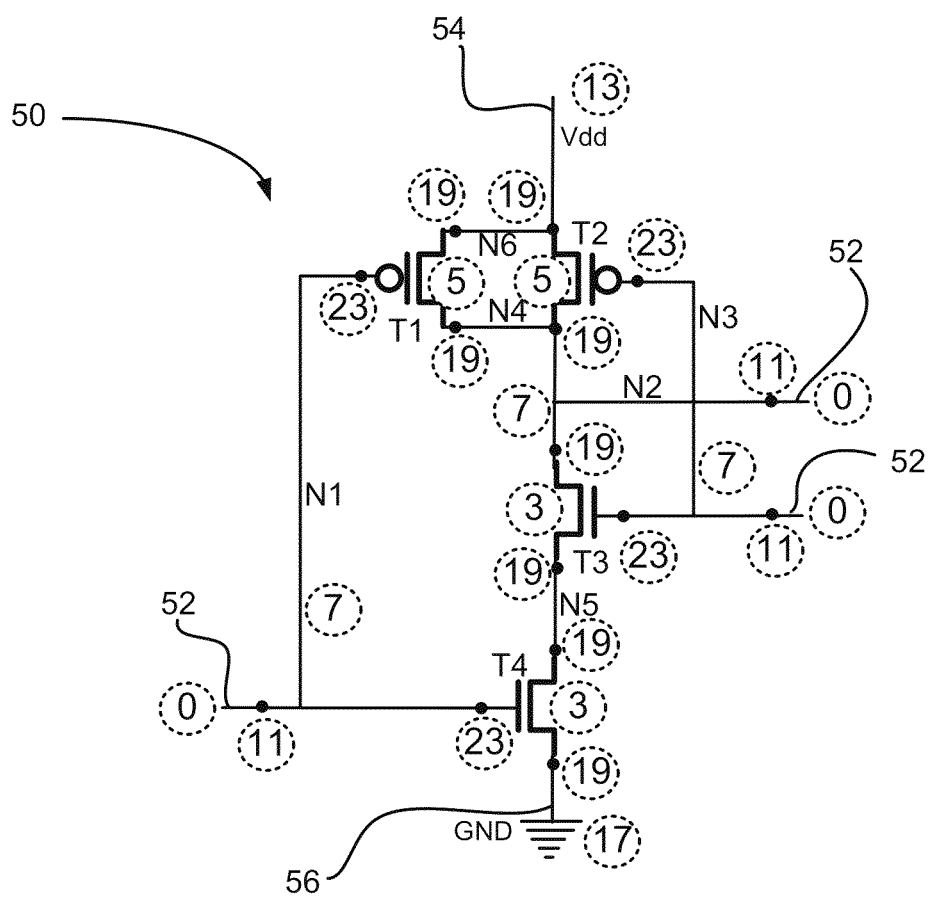
FIG. 3A illustrates exemplary initial labels for various components of the pattern, in accordance with one embodiment of the present invention.

By way of example, FIG. 3A illustrates the pattern 50 showing exemplary initial labels for various components in the pattern 50. In one embodiment, only prime numbers are used for initial labeling to avoid collision of label numbers during recursive relabeling. In another embodiment, the numbers may be chosen arbitrarily. However, choosing a distinct number for each of the component such as net, device, connection type, Vdd, GND, etc. would provide better results because during relabeling, the label will include more distinct and granular information about the topology of the circuit. In one embodiment, initial labels are applied uniformly throughout the pattern and the main netlist. Same labels are used for particular components both in the pattern 50 and the main netlist 60. For example, if an N-Transistor is given an initial label of 5, all N-Transistors in the pattern 50 and the main netlist 60 must be given the same initial label. Similarly, if a GND port is given an initial label of 17, the same number must be used throughout in the pattern as well as in the main netlist.

In one embodiment, the same label number is provided to both "Drain-to-net" and "Source-to-net" connection-types (for example, see label 19 in FIG. 3A). In other embodiment, different connection-type labels may be assigned to "Drain-to-net" and "Source-to-net" connection-types. In one embodiment, the "Gate-to-net" connection-type (for example, see label 23 in FIG. 3A) is assigned a label number that is different from the "Drain-to-net" and "Source-to-net" connection-type labels. In one embodiment, a net is a set of wires that connects two or more devices (such as transistors). The net also connects other nets or devices to the input or output ports. For example, FIG. 3A illustrates few exemplary nets such as N1, N2, N3, N4, N5, and N6 and devices T1, T2, T3, and T4. In one embodiment, the Gate-to-net connection-type label is kept different to indicate whether a net is connected to the Source/Drain terminals of a transistor or to the Gate terminal. In another embodiment, three separate connection-type labels can be assigned to the Gate, the Drain, and the Source. During the relabeling, in one embodiment, only nets and devices are relabeled. As mentioned before nets and devices are also called vertices. Note that one key requirement to making the embodiments described herein to work is to perform exactly the same initial labeling and relabeling procedures in both the pattern and the main netlist.

Still referring to FIG. 3A, a fundamental limitation of this technique is the effect of nets that are ports on the pattern. These nets will almost certainly have fewer connections in the pattern than their corresponding nets will in a valid match in the main netlist. This is due to the fact that an instance of the pattern in the main netlist must communicate with the rest of the main netlist in order to be useful. This means that even the initial labels of these nets (i.e., the nets connected to the ports) usually won't match between the pattern and the main netlist. Worse still, this mismatch of labels propagates during relabeling, along with the rest of the information that the labels hold. Thus, with each round of relabeling, successively larger areas around each port net bear invalid labels (i.e., NULL labels). In one embodiment, this problem can be solved by considering that each port net has a "kill" flag that propagates along with the relabeling. This flag can be represented simply by the use of a "null" label. Meaning, input and output ports are given initial label 0 (zero) because the topologies connected to the input and/or output are unknown (i.e., nets that are ports are given initial label 0 (zero)). Then use the following relabeling rule—"If any neighbor of a vertex has a null label, this vertex cannot be relabeled. Instead, this vertex's label becomes null as well."

Figure 3B:
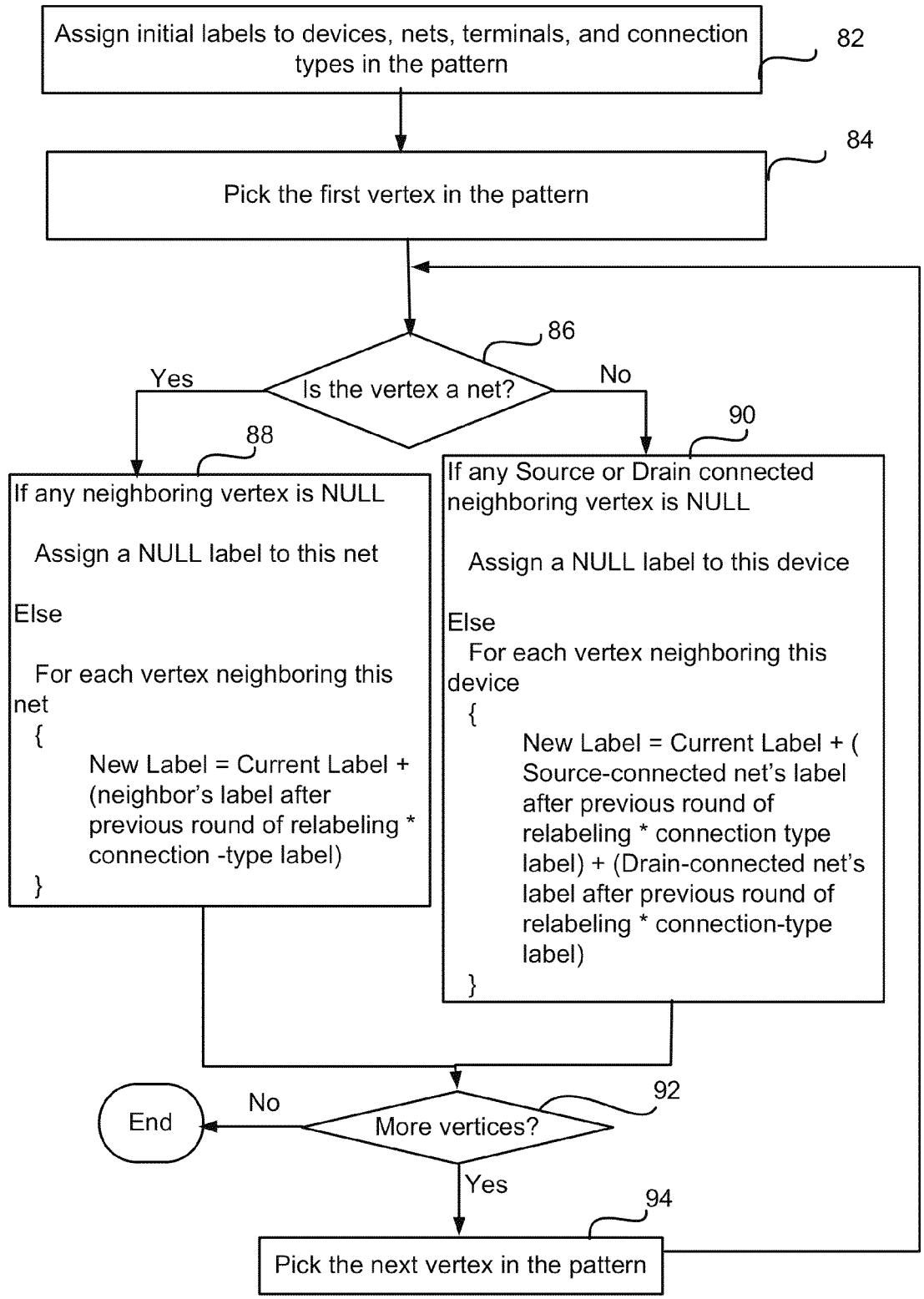
FIG. 3B illustrates a flow diagram for recursive relabeling of the vertices, in accordance with one embodiment of the present invention.
Figure 4A:
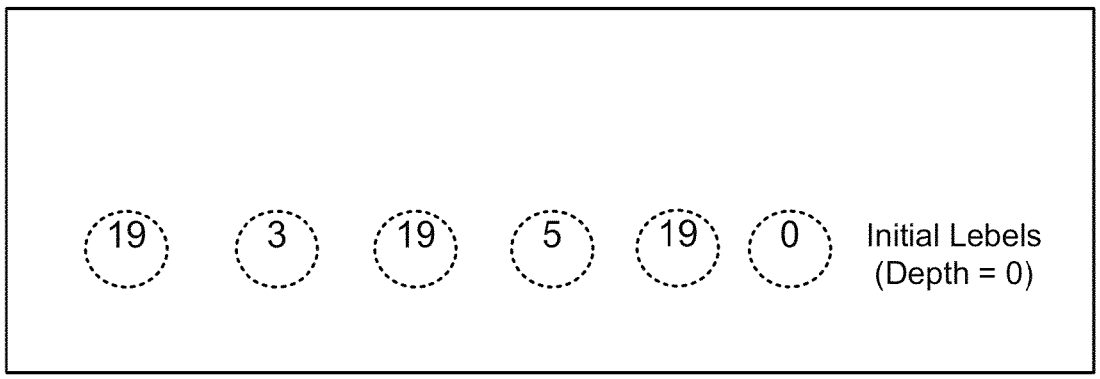
FIG. 4A-4F illustrate recalculated labels for some of the components of the patterns at different depth of recursion, in accordance with one embodiment of the present invention.
Figure 4B:
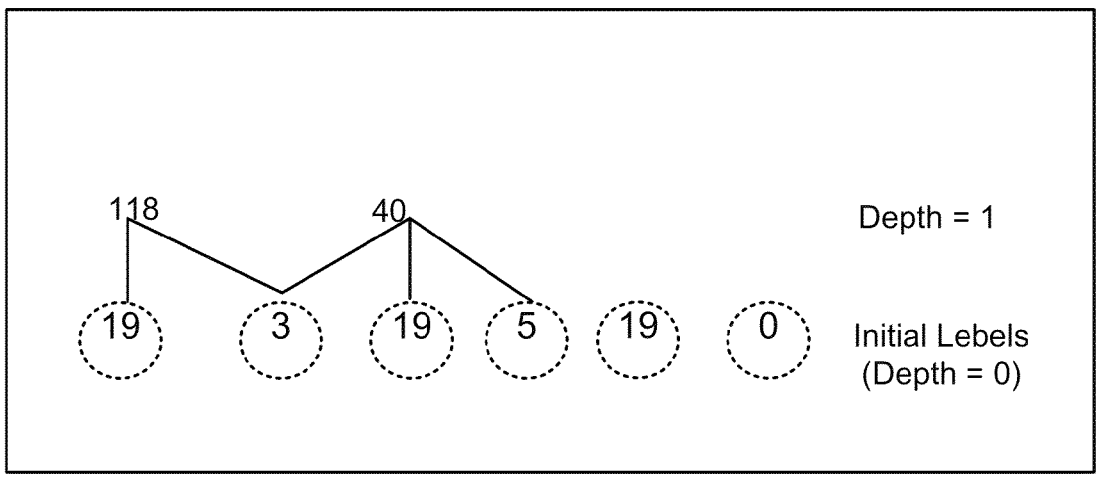
Figure 4C:
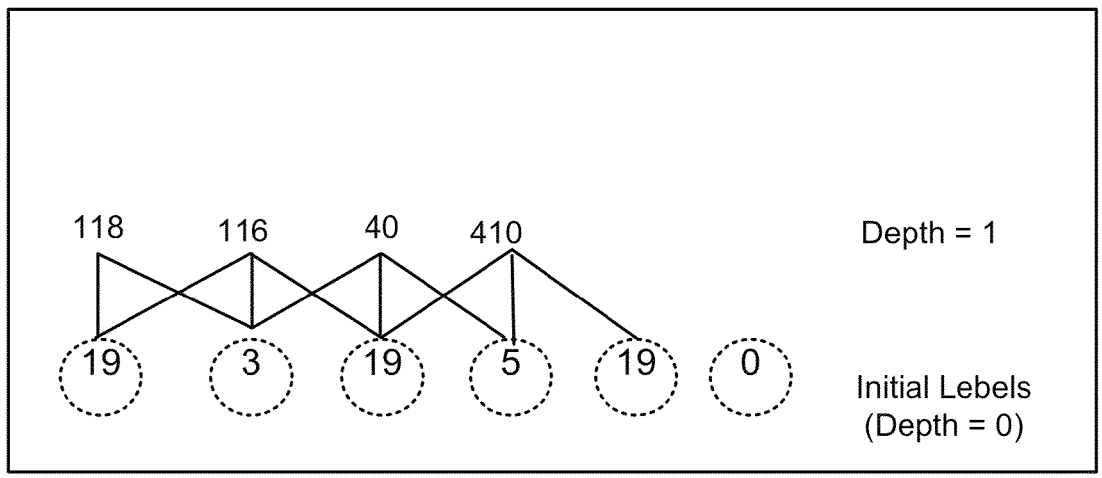
Figure 4D:
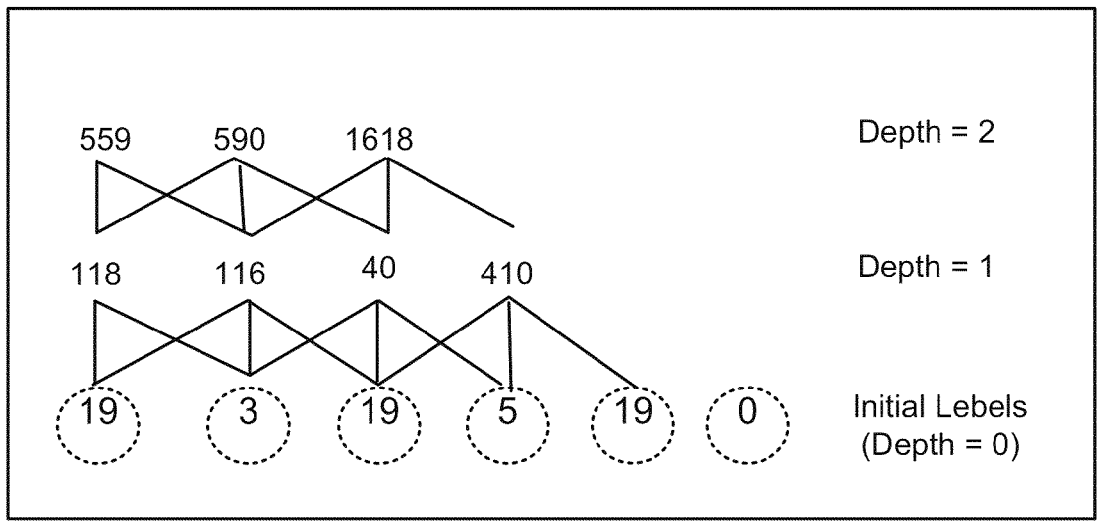
Figure 4E:
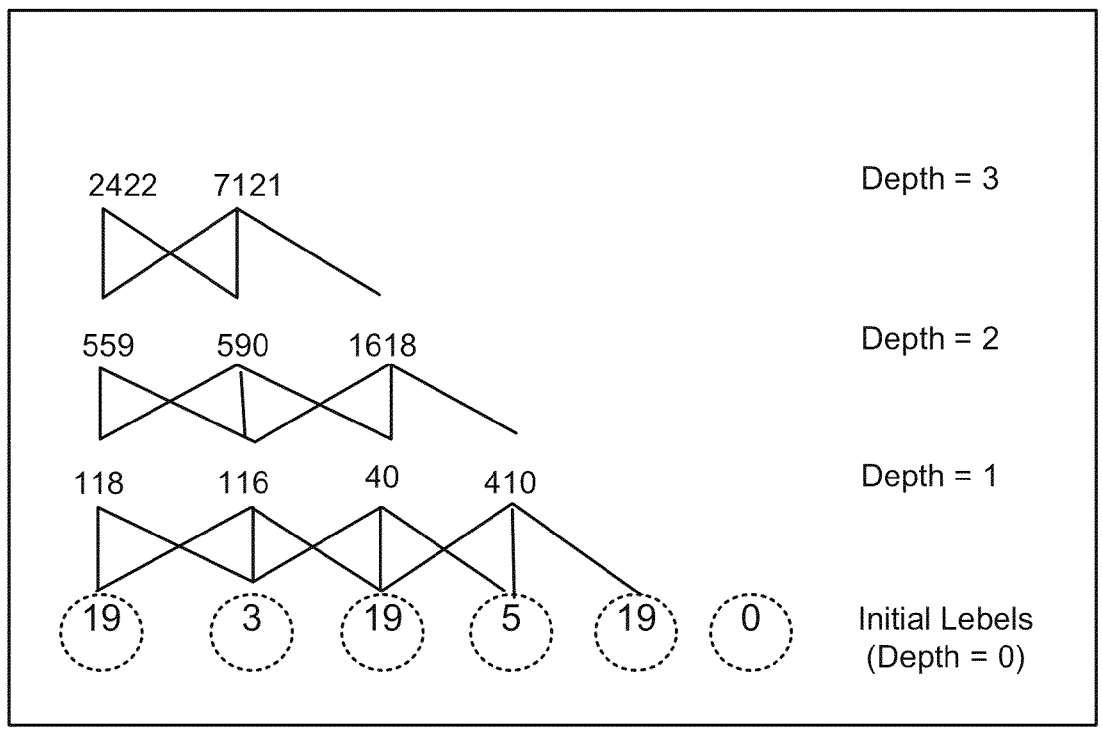
Figure 4F:
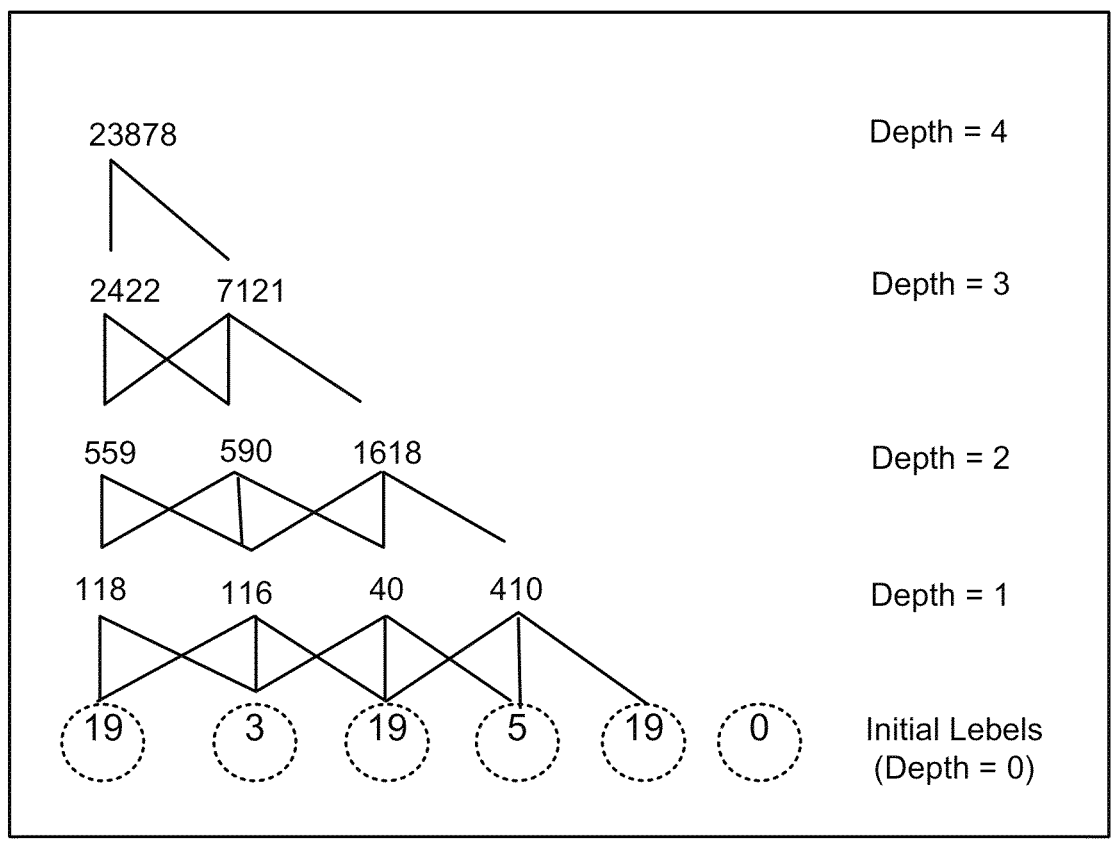

FIG. 3B illustrates a flow diagram of a process of relabeling of the vertices in the pattern. Note that the same process is also performed on the main netlist. The process of relabeling starts at operation 82 in which initial labels are assigned to devices, nets, terminals, and connection types in the pattern. The process of assigning initial labels has been described in detail in the description of FIG. 3A above. Then in operation 84, the first vertex (i.e., a device or a net) is selected. In one embodiment, any vertex can be selected from the list of all vertices because eventually all vertices will be relabeled through a recursive relabeling loop. In operation 86 a determination is made as to whether the selected vertex is a device or a net. If the selected vertex is a net, the control moves to operation 88 in which, first a determination is made whether any of the neighboring vertices connected the net is NULL. If yes, then the selected net is given a NULL label too. Otherwise, a new label of the net is calculated using the following formula:

---
Formula (1)
---
For each vertex neighboring the selected net
Do
{
    New label of the net = Current label of the net + (neighbor's label after previous iteration of relabeling * connection-type label)
}
---

Formula (1) calculates a new label for a net by multiplying the value of the label of a neighboring vertex after a previous relabeling iteration by the connection-type label (i.e., the value of the label of the connection-type that connects the net to the neighboring vertex in question) and adding to the multiplication result to the current label of the net. This process is repeated for all neighboring vertices of the selected net.

In one embodiment, a separate list of labels of each vertex after each round or iteration of the relabeling is maintained. Hence, one list is maintained for all initial labels. Another containing labels of each vertex after first round of relabeling of all vertices, yet another containing labels of each vertex after second round of relabeling, and so on. Therefore, in Formula (1), the neighbor's label after previous iteration of relabeling means that if a third round of relabeling is in progress, the labels of neighbors after second round of relabeling are used in the calculations. By extension, in round one of relabeling, initial labels of the vertices are used.

Still referring to FIG. 3B, in operation 86, if the vertex is determined to be of type device (i.e., not net), the control moves to operation 90 in which, first a determination is made whether any of the neighboring vertices connected to the Drain or the Source of the device is NULL. If yes, then the selected device is given a NULL label too. Otherwise, a new label for the selected device, in one embodiment, is calculated using the following formula:

---
Formula (2)
---
For each vertex neighboring the selected device
Do
{
    New label of the device = Current label of the device + (Source-connected net's label after previous round of relabeling * Connection-type label) + (Drain-connected net's label after previous round of relabeling * Connection-type label)
}
---

In Formula (2), the meaning of term "after previous round of relabeling" is same as described in the description of the Formula (1).

Formula (2) calculates a new label for a selected device by calculating a first multiplication result by multiplying the value of the label of the Source-connected vertex after a previous relabeling iteration by the Source connection-type label (i.e., the value of the label of the connection-type that connects the Source of the device to the neighboring vertex in question), calculating a second multiplication result by multiplying the value of the label of the Drain-connected vertex after a previous relabeling iteration by the connection-type label (i.e., the value of the label of the connection-type that connects the Drain of the device to the neighboring vertex in question), adding the first multiplication result to the second multiplication result and to the current label of the selected device. This process is repeated for all neighboring vertices of the selected device.

The control is then moved to operation 92 in which a determination is made whether more vertices are remaining to be relabeled in this round of relabeling. If no vertex is left to be relabeled in this round of relabeling, the process ends. However, if more vertices are remaining to be relabeled in this round of relabeling, the control moves to operation 94 in which the next vertex is selected and then the control moves to operation 86 again. When the process ends, one round of relabeling is finished. The new labels are stored in a separate list for use in the next round of relabeling. These lists are stored in a non-volatile data store. In one embodiment, each list includes a number representing a depth of relabeling, an identification of each vertex in the circuit and the label of the vertex after that particular depth of relabeling. An appropriate indexing of the tabular data may be employed to facilitate easy data management and access. The lists may be stored in a relational database or a similar data store or in a file in the file system. In different embodiments, the process described in FIG. 3B can also be used both in unidirectional relabeling and in bidirectional relabeling.

As explained earlier, the "kill" signal propagates from the ports to the vertices in the pattern (or, in main netlist). In one embodiment, the relabeling process ends when no more devices in the pattern (or in the main netlist) can be relabeled. In other embodiments, the relabeling can be stopped earlier if a determination is made that the remaining non-zero labels contain enough topology information to facilitate the pattern identification in the main netlist.

It should be noted that the formula for calculating a new label for a device (i.e., Formula (2)) does not include the net connected to the Gate of the device. In other embodiments, Formula (2) can be modified to include Gate connected nets and exclude either the Drain connected net or the Source connected net or both. In other words, the asymmetry in the graph is being advantageously utilized. This determination can be made based on the topology of the pattern. If there are more ports (i.e., input/output, in one embodiment) connected to the Gate, the Gate connected net is not included in the formula. One reason behind not selecting one of the terminals is to delay the propagation of the "kill" signal. This solves a big issue that is present in SubGemini. SubGemini method is useless in many cases such as in a pattern in which all or most Gates are connected to the ports (for example, a NAND gate). By SubGemini method of recalculating the labels (in a NAND gate for example), no round of relabeling is possible because every device is touching a "kill" signal (i.e., a port with the label "0"). Hence, in this case, according to SubGemini, only initial labels can be used for the identification of the pattern in the main netlist. However, Formula (2), in various embodiments, solves this issue by delaying the propagation of the "kill" signal. Therefore, several iterations of relabeling is possible even in the cases such as a NAND gate pattern. Furthermore, to achieve an optimal depth of iterations, Formula (2) can be readily adjusted to include the Gate connected nets and to exclude either the Drain connected net or the Source connected net depending on a particular type of pattern.

As mentioned earlier, the main netlist is also subjected to the same process of relabeling as illustrated in FIG. 3B. The same initial labels as used in the pattern for different types of vertices and connection types are also used for the main netlist. Further, exactly the same Formula (1) and Formula (2), as used for the pattern during the execution of operations as illustrated in FIG. 3B, are also used for the main netlist. Because the main netlist includes a larger circuit, the ports are generally far away from various vertices in the main netlist, comparatively more relabeling iterations are possible in the main netlist (due to comparatively delayed "kill" signal propagation to the inner devices in the main netlist). However, because the pattern identification is performed by comparing the labels at a same depth of relabeling, the main netlist relabeling iterations are performed only until the depth of relabeling equivalent to the final depth of relabeling in the pattern is reached.

Moving now to FIGS. 4A-4F which exemplarily illustrate a "shrinking" number of vertices and increasing label numbers after each iteration of relabeling. As mentioned in the description of FIG. 3B, the "shrinking" occurs due to propagation of the "kill" signal inward. As apparent, the number of remaining vertices shrinks with each round of relabeling and finally, in one embodiment, no additional non-zero labels can be recorded in the pattern. Alternatively, the process of performing the relabeling iterations may be ended when a desired depth or relabeling is reached and a determination is made that the labels at that depth contain enough topology information to enable the identification of the instances of the pattern in the main netlist. Term "depth" as used herein refers to number of rounds or iterations of relabeling. In one embodiment, the initial labels are considered at depth 0 (zero).

Figure 5A:
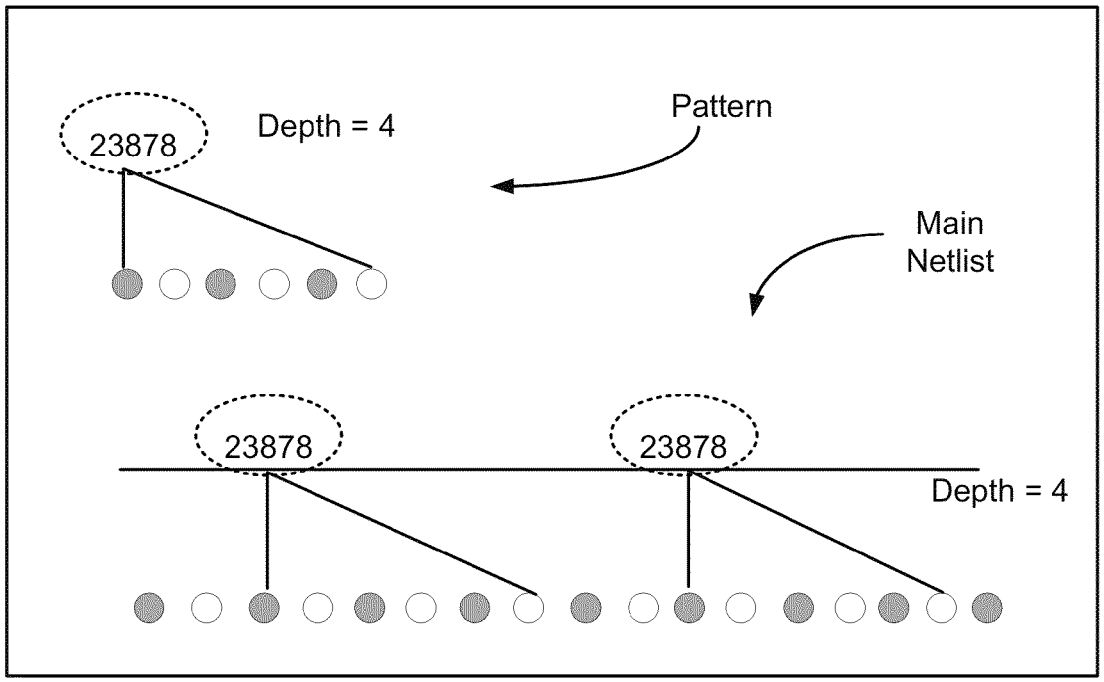
FIG. 5A-5C illustrate identifying the instances of the pattern in the main netlist based on the recalculated labels, and identifying a seed vertex in the pattern, in accordance with one embodiment of the present invention.

FIG. 5A exemplarily illustrates the process of identification of the instances of the pattern in the main netlist. The identification is performed by comparing label numbers at a same depth both in the pattern and the main netlist. For example, if at depth=4, a particular label in the pattern has the label "23878", there is a strong possibility that all labels in the main netlist with label '23878' at depth=4 represent the same topology that is present in the pattern and is represented by the label "23878". In other embodiments, labels at a lower depth (such as depth=3 in the example illustrated in FIGS. 4A-4F) may be used for comparison, if for some reason, a comparison of the labels at the maximum possible depth is not suitable. However, there is still a small possibility that even though the labels match, the actual topologies represented by these labels are different. Therefore, the embodiments of the invention also provide to check if the actual topologies also match before finalizing the identification process.

Figure 5B:
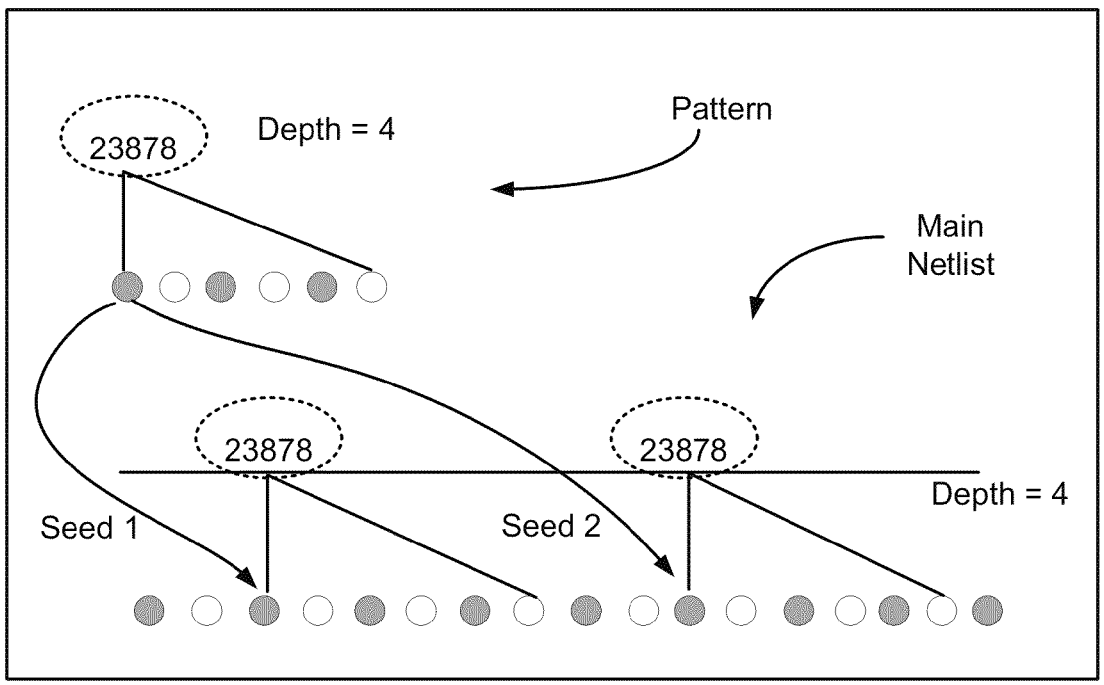
Figure 5C:
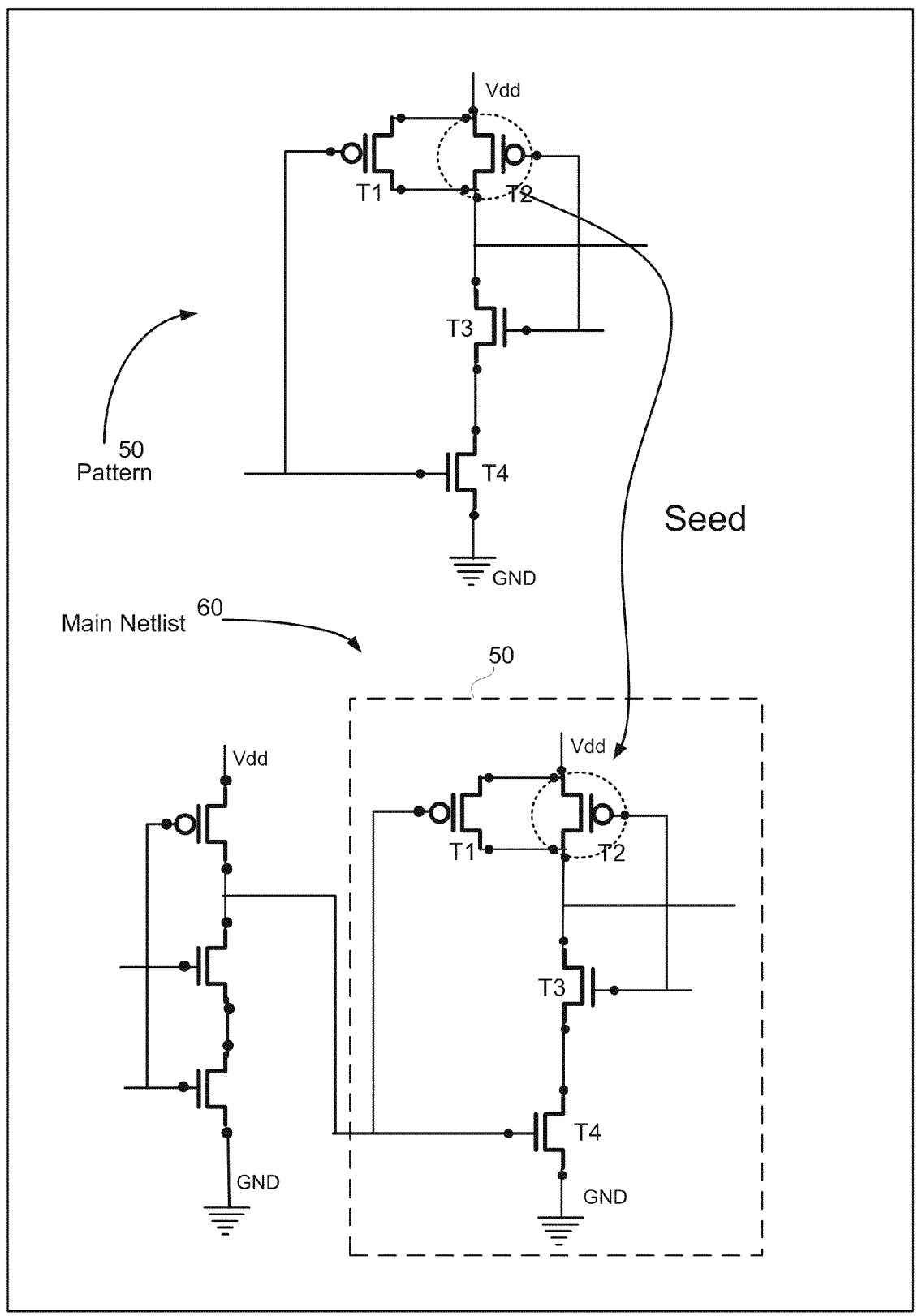

By way of example, FIG. 5B illustrates one embodiment of a "Phase-2" process for further verifying the identification of the instances of a pattern in the main netlist, the process of relabeling, as illustrated in FIG. 3B, being "Phase-1". In Phase-2, a seed vertex is identified. In one embodiment, the seed vertex is a vertex that is represented by the label used for the comparison of labels in "Phase-1", as illustrated in FIG. 5A. FIG. 5C, by way of example, provides a clearer view of a seed vertex (or node) at the circuit level.

Figure 6A:
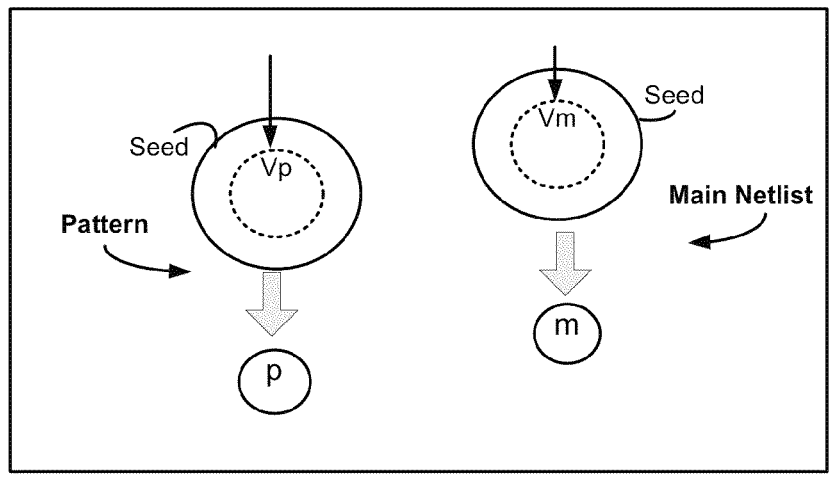
FIG. 6A-6C illustrate exemplary reverse checking of the labels to eliminate any false label match in the main netlist, in accordance with one embodiment of the present invention.
Figure 6B:
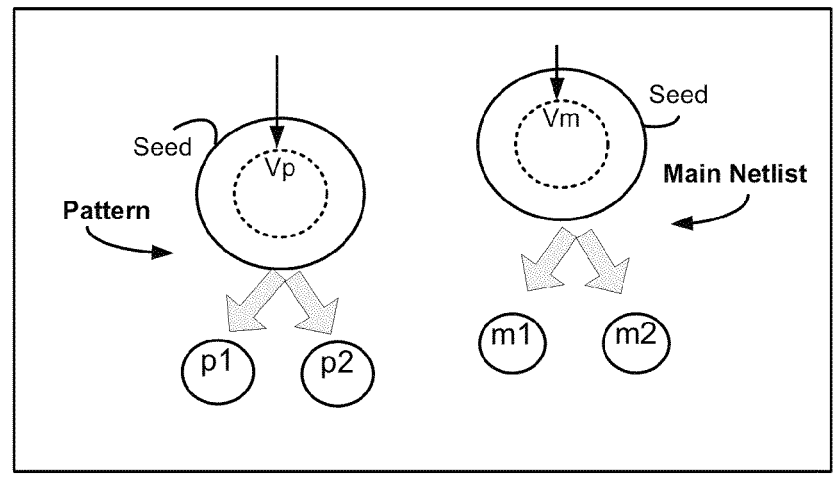
Figure 6C:
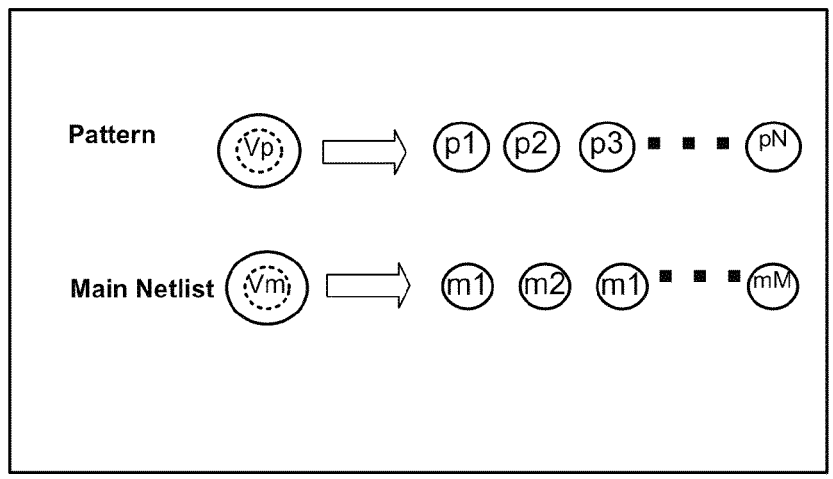

FIGS. 6A-6C exemplarily illustrates further steps of Phase-2 after a selection of a seed vertex. Starting from the seed node and working in parallel on both the pattern and the main netlist, the topology around the seed is checked for similarities. For example, suppose T2 (in FIG. 5C) is a seed node or vertex. The "Phase-2" process includes the following operations. First check if the seed vertices in the pattern and the main netlist correspond to same type of vertex (i.e., transistor T2 in the current example). Check is then made to see how many vertices are connected to the transistor T2. If only one vertex is connected to T2 in both the pattern and the main netlist (FIG. 6A "p" and "m"), check to see if "p" and "m" are same type of vertices. If yes, move to "p" in the pattern and "m" in the main netlist and repeat the previous operation (i.e., check to see how many vertices are connected to "p" and "m" and so on). If there are two vertices connected to "p" and "m", check if "p1" is same as "m1" and "p2" is same as "m2". If fails, check if "p1" is same as "m2" and "p2" is same as "m1" (see FIG. 6B). If any of these checks pass, move forward to either "p1" or "p2" and keep repeating the previous operation until a mismatch is found, or there are no more unvisited vertices in the pattern.

Referring to FIG. 6C, if there are multiple vertices connected to the seed vertex in the checking path, a nested loop is used to cover all "p#" and "m#" pairs in one embodiment. In one embodiment, a net-to-device pair comparison is made. Note that the seed or a vertex in checking path in the pattern may be connected to different numbers of other vertices compared to the seed or similar vertex in the main netlist. Therefore, as illustrated in FIG. 6C, the number "N" (as used in term "pN" in FIG. 6C) may be different from the number "M" (as used in term "mM" in FIG. 6C). Typically, N will be less than or equal to M if node vp (FIG. 6C) is a connected to a I/O port. Otherwise, M should be equal to N. Further, if unique pairs are found, these pairs are iterated first before moving further in the checking path. If any ambiguous pair is found, try (p1,m1), then if fails try (p1,m2), then (p1,m3), etc. within the set of ambiguous pairings. In one embodiment, the pattern neighbor list is reordered and checking is performed again. If case of a failure, this reordering is attempted again and again until no more unique reordering is possible.

Term "working in parallel" as used herein means that exactly same steps are taking in parallel on both the pattern and the main netlist. For example, if the process is implemented in software, two "threads" or two "processes" executing simultaneously can be used. However, "working in parallel" does not imply that any two similar steps are being performed exactly at the same time. These steps could be performed at a delay so long as one operation step being performed on the pattern can be repeated in the main netlist.

If in "Phase-2" a mismatch if found during the vertices retracing, the instance of the pattern in which the mismatch was found could have been falsely identified during "Phase-1" identification. If "Phase-2" retracing is successful, the identification process is successfully performed and the pattern matching of "Phase-1" is confirmed. In one embodiment, "Phase-2" may be omitted if the process performing entity determines that the "Phase-1" results are accurate within an acceptable margin or errors.

Figure 7:
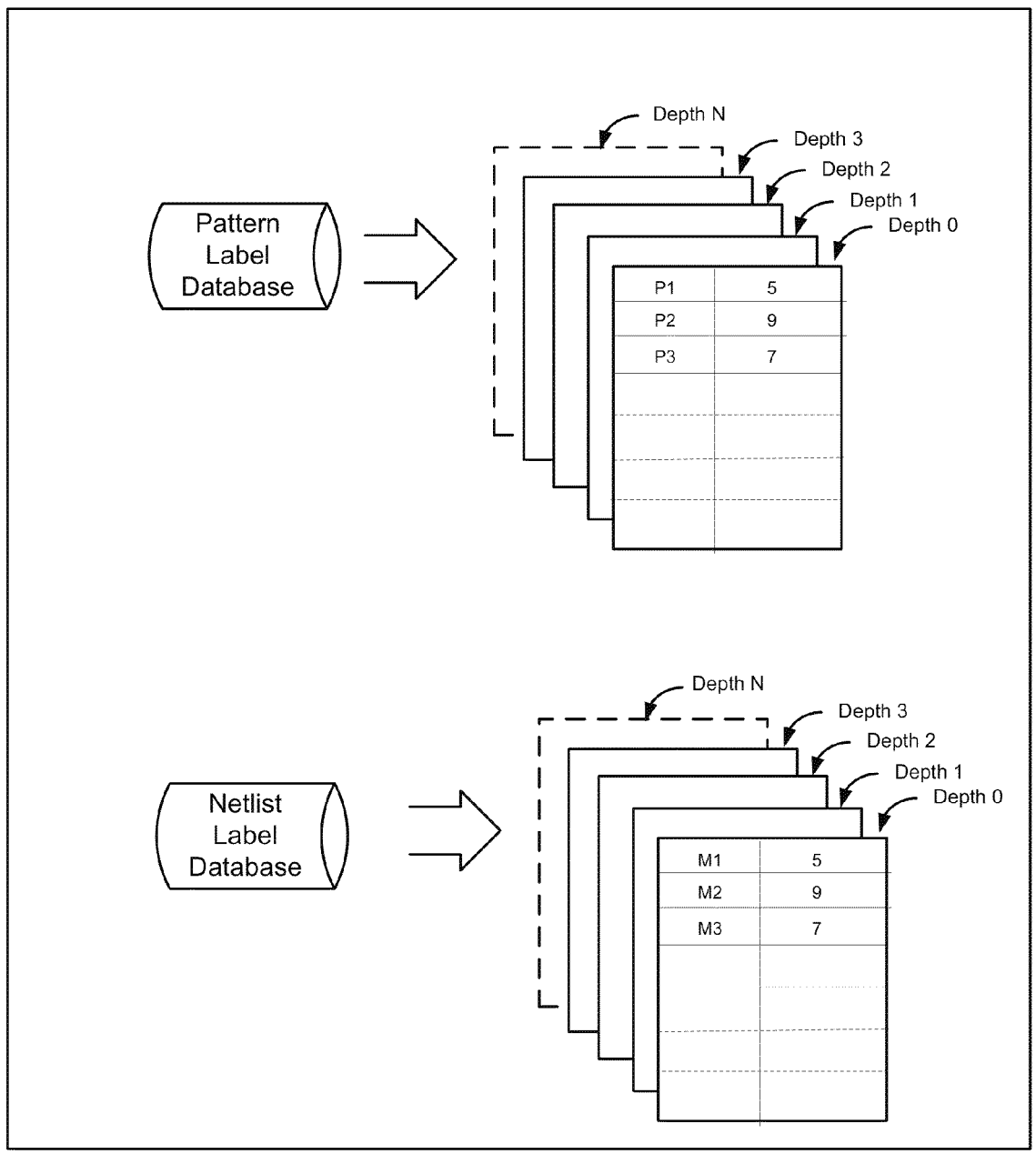
FIG. 7 illustrates exemplary data structures for storing labels of vertices after each iteration of relabeling, in accordance with one embodiment of the present invention.

FIG. 7 illustrates exemplary data structures of a pattern label database and a netlist label database. In one embodiment, the pattern label database and the netlist label database are maintained in a relational database management system. In other embodiments, these databases can be maintained in any type of database management system so long as the stored data is searchable. In one embodiment, the label data of each vertex after each iteration of relabeling according to the "Phase-1" is stored in a separate table. In another embodiment, a single table can be used to store the label data of each vertex categorized by the iteration number or the depth of the relabeling iterations. In yet another embodiment, the label data pertaining to the pattern and the label data pertaining to the main netlist can be stored together in a single table using an appropriate differentiating identification associated with each line in the database table.

In one embodiment, each vertex in the pattern and the main netlist is given a unique identity. This unique identify of a vertex along with the vertex label is stored together after each relabeling iteration.

Figure 8:
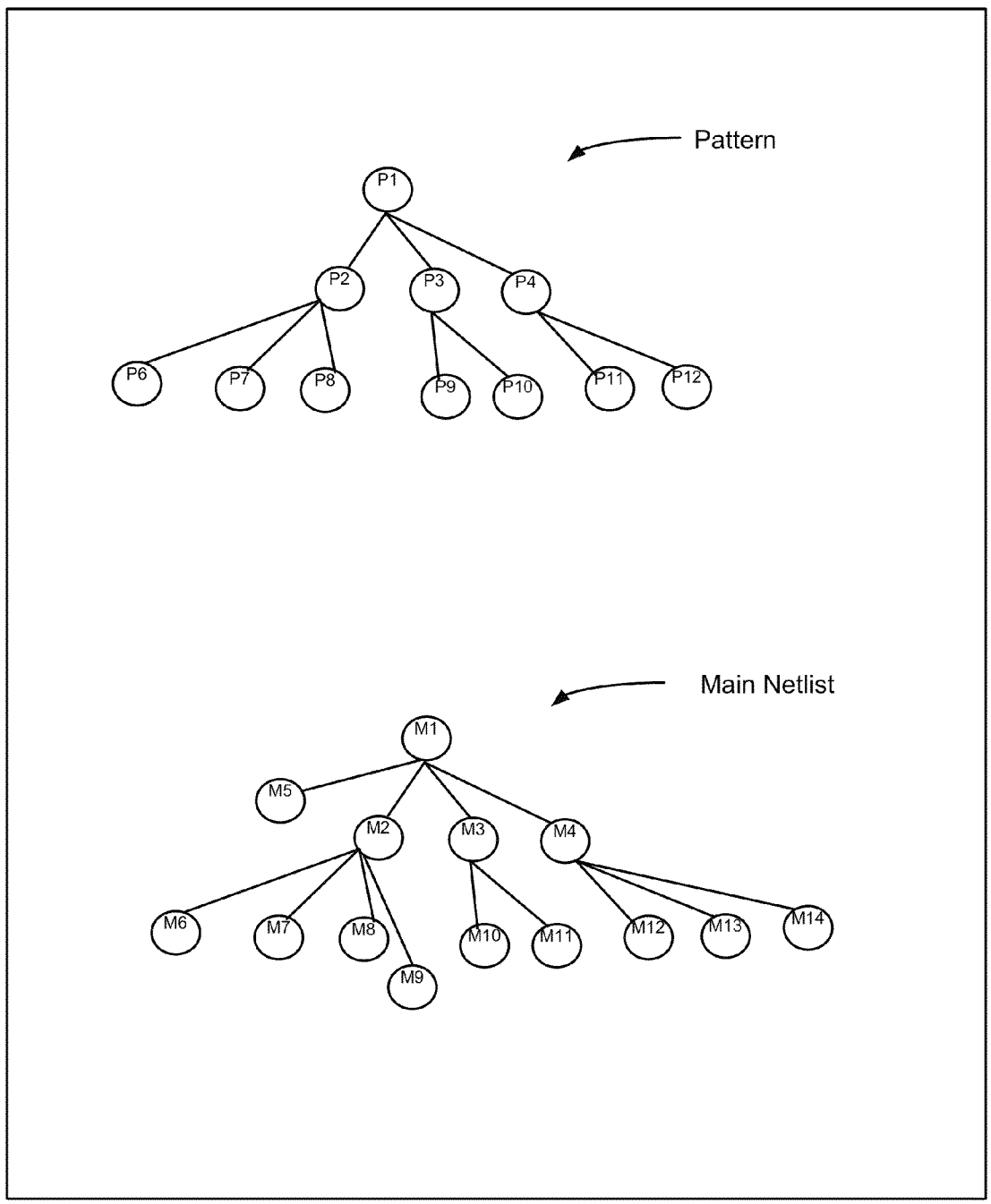
FIG. 8 illustrates exemplary node graphs to describe matching of the nodes in the pattern with the nodes in the main netlist, in accordance with one embodiment of the present invention.

FIG. 8 illustrates exemplary node graphs to describe by the way of examples a process of circuit tracing of the vertices in "Phase-2". One aspect of the circuit tracing is illustrated and described by FIGS. 6A-6C in which the "Phase-2" process is performed to verify the pattern matching of "Phase-1" to eliminate any false identification of the subcircuit in the main netlist. As described earlier in the description of FIGS. 6A-6C, in one embodiment, this verification is performed by attempting to trace the circuit outwards from the seed vertices both in the pattern and the main netlist to match the neighboring vertices recursively. If all the vertices in the pattern are matched with the corresponding vertices in the main netlist, the subcircuit identification of "Phase-1" is confirmed. In another embodiment, the labels of the vertices are used in the matching operation. In yet another embodiment, the matching operation includes both the vertex type checking (as described in FIGS. 6A-6C) and the label checking. In other embodiments, other methods of circuit tracing can be employed so long as all vertices in the pattern can be matched with corresponding vertices in the main netlist.

In the label checking operation, after seed vertices are identified in the pattern and in the main netlist, the directly connected neighboring vertices are counted. For example, in FIG. 8, the pattern includes a seed vertex P1, which has three neighboring vertices P2, P3, and P4. If the main netlist has less number of neighboring vertices to a corresponding seed vertex in the main netlist, the matching operation fails and the matching operation is then attempted on another seed vertex in the main netlist. However, since the pattern inside the main netlist may be connected to other circuit components, the existence of more neighboring vertices is not an indication of mismatch.

Then, each neighboring vertex in the pattern is attempted to be matched with a corresponding neighboring vertex in the main netlist. For example, P2 is attempted to be matched (or paired) with any of M2, M3, M4 and M5. In one embodiment, the term "matching" means comparing the labels of the vertices at a same depth level. In one embodiment, if pattern vertex P2 has a max labeling depth of 3, then we will also look to the labels of M2, M3, M5, and M5 at depth=3. In other embodiments, the label at a depth below the pattern vertex's max labeling depth can also be used, as long as the labels from the same depth of the main-netlist vertices are used for this vertex pairing operation. This will not impact the functionality, but the performance will generally be best if the max-depth pattern labels are used. As described earlier, the label data of each vertex after each relabeling iteration along with the depth information and unique identification of each vertex is stored in a database (see FIG. 7) during the "Phase-1" operation. This label data is reused in the circuit tracing operation. If the label of any one of M2, M3, M4 and M5 matches with the label of P2, P2 is marked as matched and this marking flag is stored in a database or a data store. This process is repeated for remaining neighboring vertices, i.e., P3 and P4. Then, this same process is repeated for P6, P7, P8, and other remaining vertices in the pattern.

However, if for instance the label of P2 matches with more than one corresponding vertex in the main netlist (for example, P2 matches with M3 and M4 both), there is an ambiguity as to which one of M3 and M4 is a good match. To ascertain a good match, further matching is attempted in the neighboring vertices of P2 with the children nodes of M3 and M4 separately. A match is not confirmed until all children of a vertex are matched. For example, the children of P2 are attempted to be matched with the children of M4 recursively to make sure there is not false match. If any mismatch is found at any level, the match is discarded. When all children of P1 are matches, the subcircuit identification of "Phase-1" process is confirmed. In one embodiment, a parallel processing is employed to enhance the performance of matching of the labels of vertices at various levels. It should be noted that the process of verification of the circuit identification as described throughout this document can be applied both in "depth-first" or "breadth-first" pairing techniques, or any combination of the two, or any other manner in which the pattern and the main netlist topologies are traced in parallel.

As described earlier, the label of a vertex contains the topology information of the circuit around the vertex. Note that the initial labels (i.e., labels are depth=0) don't contain surrounding topology information. These initials labels have information of the nets or devices by themselves. Therefore, comparing the same depth labels of the vertices provides improved and efficient way of verifying the subcircuit identification. This circuit tracing using the vertices labels can be performed alone or in combination of the circuit tracing process using the vertex types as described in FIGS. 6A-6C. This circuit tracing process using vertex or vertices labels improves the identification process by eliminating any false identification of the subcircuits in "Phase-1". One aspect of the improvement is apparent from the fact that the circuit tracing using the vertex types, in one embodiment, does not differentiate between the Drain connected and Source connected nets. Hence, there is a chance of misidentification when the pattern matches in all respect except that at least one of the devices has the Drain and Source connection reversed. The circuit tracing process using the vertex labels eliminate this possibility because if the Drain and Source are interchanged, the node graph will probably also change and would lead to label mismatches. Also, it may be noted that there can be "true" symmetries within a pattern either due to the source/drain interchangeability, or due to other structures. In such cases, there are multiple different "right" ways to match up vertices with a true match in the main netlist. The "phase-2" process as described herein, in one embodiment, will accept the first configuration it happens to come across. The mapping may end up different from what a human observer might have expected, but it will be topologically equivalent.

Figure 9:
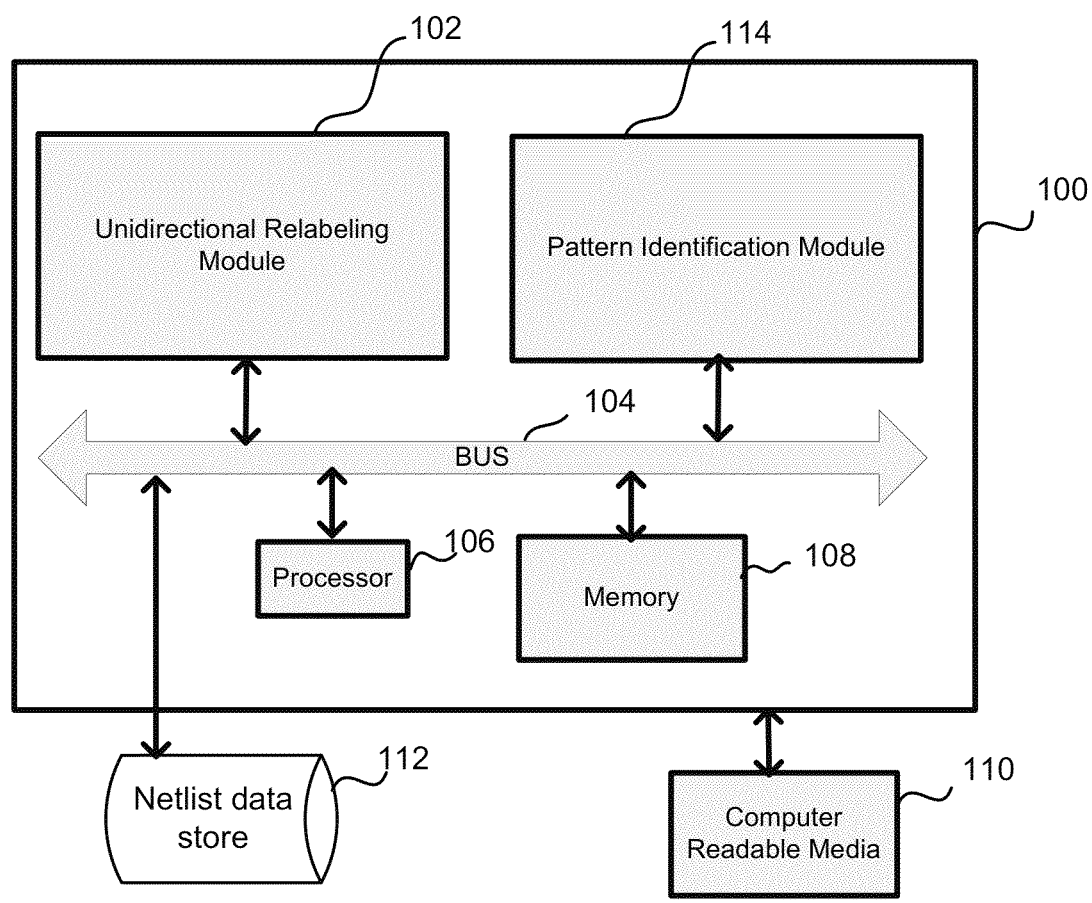
FIG. 9 illustrates an exemplary computer system to perform unidirectional relabeling, in accordance with one embodiment of the present invention.

FIG. 9 illustrates an exemplary computer system 100 for performing the process of relabeling of vertex in order to identify the instances of the pattern in the main netlist. Note that many components of the computer system 100 that are well known to be a part of a computer system are omitted for clarity. The computer system 100 includes a processor 106, a memory 108, a bus 104, and a Unidirectional Relabeling Module 102. The computer system 100 also includes a Pattern Identification Module 114. The Unidirectional Relabeling Module 102, in one embodiment, is in communication with an external Netlist data store 112 to receive the patterns and netlists to be processed. A computer readable media 110 is also included in one embodiment to provide storage of data and programming instructions. The Unidirectional Relabeling Module 102 and the Pattern Identification Module 114 can be implemented in hardware or software. The Unidirectional Relabeling Module 102 performs initial and recursive unidirectional relabeling of the vertices in the pattern and the main netlist. The Pattern Identification Module 114 performs the task of circuit tracing (as described in FIGS. 6A-6C and FIG. 8) of the pattern in the main netlist based on the results of the relabeling operations.

Part II. Label Computation and Reuse for Multiple Patterns:

The aforementioned embodiments describe how a label for each vertex of a pattern is generated and verified against a corresponding vertex in the circuit. These labels encode topological information associated with each vertex of the pattern. The pattern matching embodiments will now be described in Part II by defining how these generated labels are reused when finding matches of a plurality of patterns in the main netlist.

A method for matching a pattern in a main netlist is disclosed. In one embodiment, the data corresponding to the main netlist and the pattern are read. The main netlist and the pattern include a plurality of vertices. Each of the vertices is a net or a device. Labels for each of the vertices in the main netlist and the pattern are computed up to a depth appropriate for the given pattern. These labels are then used to find "seed" pairings between pattern and main netlist vertices. The labels also serve to accelerate the subsequent topology-tracing process that completes and verifies the matches. The computed labels of the main netlist are stored and made available for possible reuse in subsequent matches of other patterns. While the present invention is described with reference to the foregoing embodiments, those skilled in the art will understand that many variations may be made therein without departing from the spirit and scope of the invention as defined in the following claims. The scope of the invention should, therefore, not be limited to the description of the invention, rather, the scope of the invention should be defined by the claims including the full scope of equivalents thereof.

Figure 10:
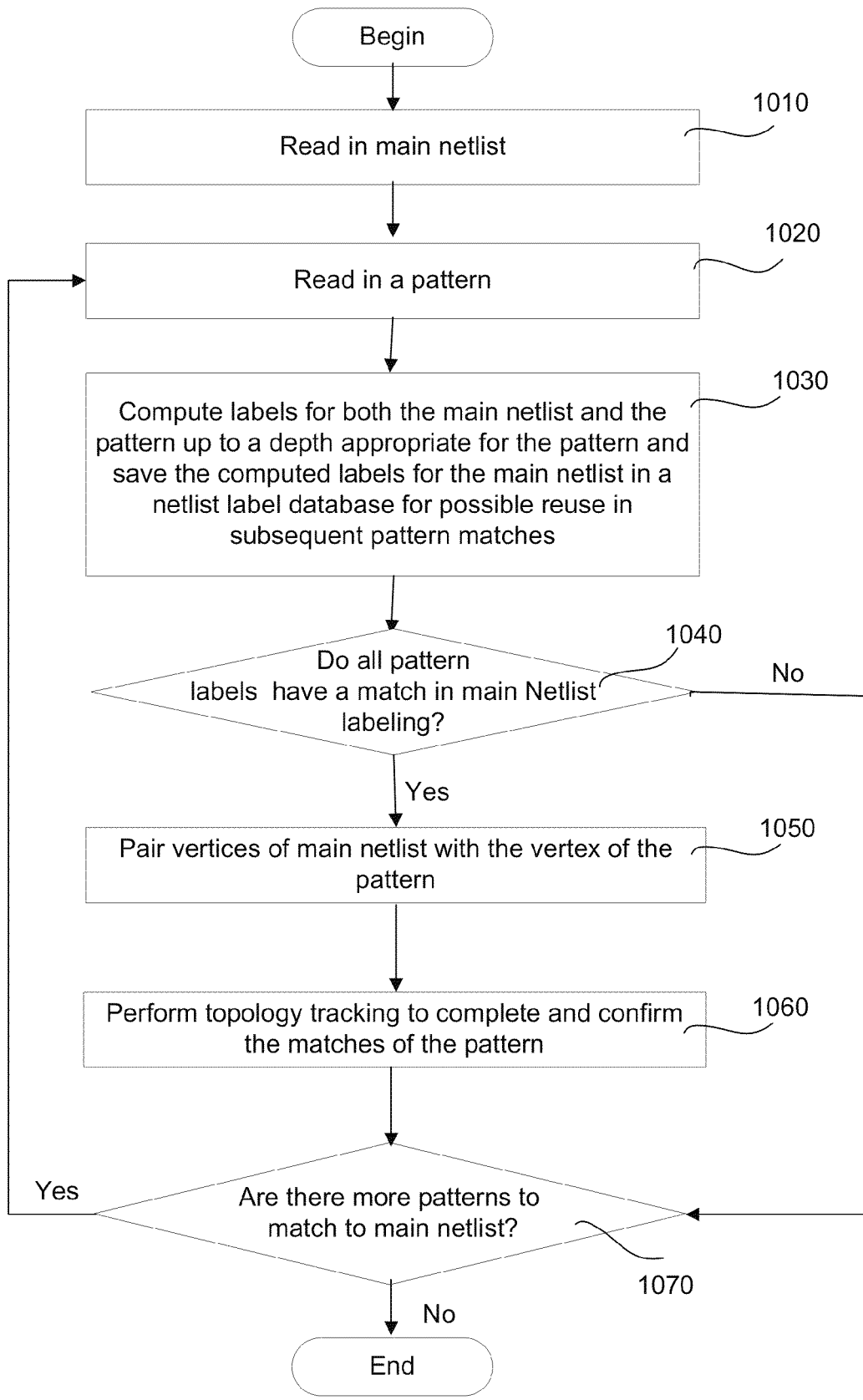
FIG. 10 illustrates a flow diagram for matching a pattern in a main netlist, in accordance with one embodiment of the invention.

FIG. 10 illustrates a flow diagram of a method for matching a pattern in a main netlist. The method begins at operation 1010 wherein a main netlist is read. In operation 1020, a pattern for finding matches is read. Reading of the main netlist and the pattern includes reading data related to the main netlist and the pattern including data related to a plurality of vertices. The data associated with the main netlist and the pattern are read in to a memory of a computer system for processing by an algorithm executed by a processor in the computer system. Each vertex in the main netlist and the pattern is either a device or a net. In one embodiment, the data for the main netlist may be stored in a relational database, such as a netlist database, and the data related to the pattern may be stored in another relational database, such as a pattern database. In another embodiment, the data for the main netlist and the data for the pattern may be stored in a single relational database, such as the netlist database, albeit distinctly. In any event, the data for the main netlist and the pattern identify the plurality of vertices that make up the main netlist and the pattern, respectively.

Upon reading the data associated with the main netlist and the pattern, labels for each of the vertices in the main netlist and the pattern are computed, as illustrated in operation 1030. The computed labels for the main netlist are stored in a netlist label database. The labels can be computed using any one of the aforementioned formulas, formula 1 or formula 2, that are described extensively with reference to FIG. 3A, wherein corresponding devices/nets comprising matching topology will be assigned the same label in both the main netlist and the pattern. The label for a vertex serves as an encoding of the topology surrounding and including the vertex. The amount of neighboring topology included in the label corresponds to the label depth, which is the number of relabeling iterations that have been performed on this vertex. The maximum number of iterations that can be performed on any vertex in a pattern, also termed the "maximum labeling depth" of the pattern, is limited due to the propagation of "kill" flags, as described above. As operation 1030 proceeds, relabeling iterations are performed for the pattern until either the pattern's maximum labeling depth is reached, or until some other number of iterations less than the pattern's maximum labeling depth is reached, depending on a variety of possible criteria. Relabeling iterations are also performed on the main netlist, but only until the number of iterations that have been performed for the main netlist equals the number of iterations that were performed on the pattern. Crucially, if the main netlist's existing labeling data is already the product of an equal or larger number of relabeling iterations than the number chosen for the pattern, no more relabeling iterations on the main netlist are performed. It should be noted that the same main netlist label database is persistently made available throughout the overall flow, for all pattern matches.

Upon computing the labels of each of the vertices in both the main netlist and the pattern, a check is performed, as illustrated in decision point 1040. In this check, if a label of a pattern vertex at some depth is found to not exist at that depth for any vertex in the main netlist, it is then known that no match of the pattern is possible in the main netlist. If that is the case, the remaining steps are then skipped for this pattern, and the flow proceeds to finding matches for a next pattern, if any.

After verifying that the existence of at least one match of the pattern is not ruled out, we proceed to operation 1050, in which a labeled vertex in the pattern is chosen, and the label for that vertex at a depth for which labeling exists for that vertex (typically, but not necessarily, the maximum depth for that vertex) is selected. Then all vertices of the main netlist bearing that same label at that same depth are located. Each pairing of the chosen pattern vertex and one of these main-netlist vertices is termed a "seed" pair, as depicted in FIGS. 5B and 5C. These pairs form the start points for the formation of all the potential matches of the pattern in the main netlist.

To fully find and verify each match of the pattern in the main netlist, a topology-tracing algorithm is performed, as illustrated in operation 1060. As described above in reference to FIGS. 6A through 6C and FIG. 8, this process walks from the seed pairing to pairings of topologically adjacent vertices in the pattern and main netlist, proceeding until a valid pairing is found for every vertex in the pattern, at which point it is deemed that a match of the pattern has been found. If no combination of vertex pairings allows for a valid match to be built from that seed pairing, the match-building for that seed is deemed a failure, and the flow moves on to the next seed pairing.

After all possible matches of the pattern have been identified, a check is made to determine if there are more patterns for which matches are to be found in the main netlist, as illustrated in decision point 1070. If there are more patterns, then the process repeats from operation 1020 where the pattern is read in and one or more matches are found.

Each time step 1030 is executed for a pattern, the main netlist label database may remain the same if it is the result of enough labeling iterations to match the number of labeling iterations done on the pattern, or it may be added to incrementally via additional labeling iterations if a larger number of labeling iterations have been performed for the pattern than have thus far been performed for the main netlist. The reuse of the labeling data from labeling iterations already performed on the main netlist constitutes a substantial savings in work performed, and thus can substantially increase the efficiency of the overall pattern-matching process. The savings become increasingly beneficial as more patterns are matched against the same main netlist.

The aforementioned embodiments describe a more accurate and efficient way of finding matches of a pattern using the labels of vertices that define the topology information and confirming that all vertices starting from a vertex of the pattern match with one or more vertices of the main netlist. By allowing reuse of computed labels of vertices, faster matching of subsequent patterns can be accomplished.

Figure 11:
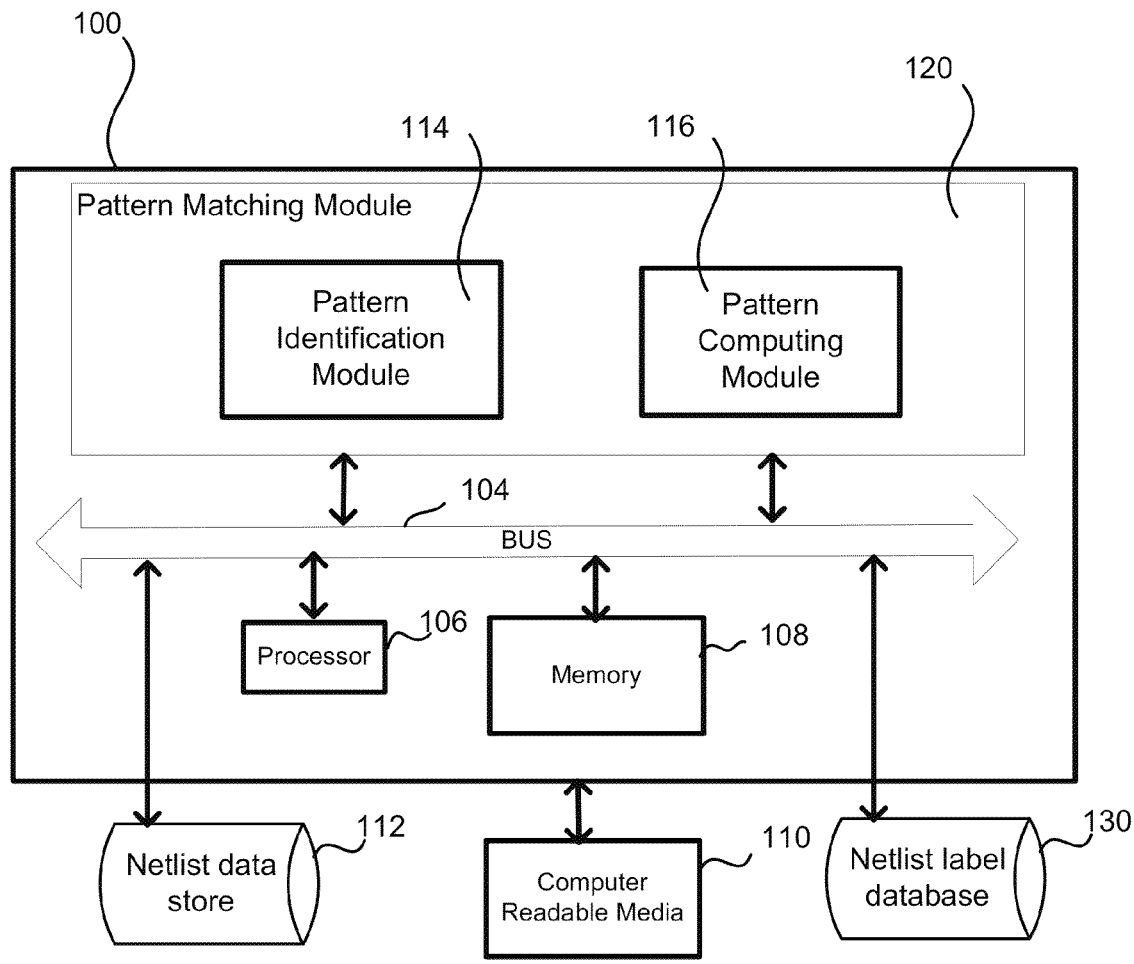
FIG. 11 illustrates a block diagram of a system for matching a pattern in a main netlist, in one embodiment of the invention.

FIG. 11 illustrates an exemplary computer system 100 for matching a pattern in the main netlist. Components of the computer system 100 that are well known to be a part of the computer system are omitted for clarity. The computer system includes a memory 108, a processor 106 a bus 104 and a pattern matching module 120. The pattern matching module 120 may include additional sub-modules within. In one embodiment, the pattern matching module 120 includes a pattern identification module 114 and a pattern computing module 116. The pattern identification module 114 identifies a plurality of vertices in the main netlist that match the vertex of a pattern for which matches are being found. The pattern computing module 116 is used to compute labels for all vertices in the pattern and the main netlist up to a depth appropriate for the pattern and to store the computed labels. The pattern computing model 116 interacts with the pattern identification module 114 to find matches of the pattern in the main netlist using the computed labels. The pattern matching module 120 can be implemented in hardware or software. The pattern matching module 120, in one embodiment, is in communication with an external netlist datastore to read the data associated with the main netlist and one or more patterns for finding matches. A computer readable medium 110 is also included in one embodiment to provide storage of data and programming instructions. The pattern matching module 120 is also in communication with a netlist label database 130 to store and retrieve computed labels for the various vertices in the main netlist. The netlist label database 130 helps in the reuse of the labels when finding matches of the pattern in the main netlist. In one embodiment, the netlist label database 130 is external to the computer system but is accessible to the pattern matching module 120. It should be noted that the netlist datastore 112 and/or netlist label database 130 can be internal to the computer system and accessed by the pattern matching module 120 during the process of finding matches for the pattern.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The programming modules, page modules, and, sub-systems described in this document can be implemented using a programming language such as Flash, Ruby, JAVA, C++, C, C#, Visual Basic, JAVA Script, PHP, XML, HTML etc., or a combination of programming languages. Commonly available application programming interface (API) such as HTTP API, XML API and parsers etc. are used in the implementation of the programming modules. As would be known to those skilled in the art that the components and functionality described above and elsewhere in this document may be implemented on any desktop operating system which provides a support for a display screen, such as different versions of Microsoft Windows, Apple Mac, Unix/X-Windows, Linux etc. using any programming language suitable for desktop software development.

The programming modules and ancillary software components, including configuration file or files, along with setup files required for performing the process of relabeling of the vertices and related functionality as described in this document, are stored on a computer readable medium. Any computer medium such as a flash drive, a CD-ROM disk, an optical disk, a floppy disk, a hard drive, a shared drive, and an storage suitable for providing downloads from connected computers, could be used for storing the programming modules and ancillary software components. It would be known to a person skilled in the art that any storage medium could be used for storing these software components so long as the storage medium can be read by a computer system.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

The invention can also be embodied as computer readable code on a computer readable storage medium. The computer readable storage medium is any data storage device that can store data, which can thereafter be read by a computer system. Examples of the computer readable storage medium include hard drives, network attached storage (NAS), read-only memory, random-access memory, CD-ROMs, CD-Rs, CD-RWs, DVDs, Flash, magnetic tapes, and other optical and non-optical data storage devices. A computer readable medium can also be distributed over a network coupled computer systems so that the computer readable code is stored and executed in a distributed fashion.

While this invention has been described in terms of several preferable embodiments, it will be appreciated that those skilled in the art upon reading the specifications and studying the drawings will realize various alternation, additions, permutations and equivalents thereof. It is therefore intended that the present invention includes all such alterations, additions, permutations, and equivalents as fall within the true spirit and scope of the invention.

What is claimed is:

1. A computer implemented method for matching a pattern in a main netlist, the method comprising:
    (a) reading in the main netlist by a processor of the computer;
    (b) reading in a pattern for finding matches in the main netlist by the processor, wherein the main netlist and the pattern include a plurality of vertices, each of the vertices being a net or a device;
    (c) computing labels for each of the vertices in both the main netlist and the pattern up to a depth appropriate for the pattern by the processor, wherein the label for each of the vertices is computed through iterative relabeling to encode topology surrounding and including each of the vertices such that the vertices with matching topology are assigned a same label in both the pattern and the main netlist;
    (d) matching a vertex of the pattern with one or more vertices of the main netlist using the computed labels by the processor;
    (e) storing the computed labels including data related to depth for each of the vertices in the main netlist;
    (f) reading in a next pattern to be the pattern, and
    (g) performing operations (c)-(e),
    wherein the matching of the next pattern is performed by determining a depth of the next pattern and reusing stored labels computed for the main netlist when the depth of the next pattern is less than or equal to the depth of the vertices in the main netlist for which computed labels are stored, and when the depth of the next pattern is greater than the depth of the vertices in the main netlist with computed labels each computing in (c) is for vertices in the main netlist for which labels have not yet been computed and each storing in (e) adds newly computed labels to stored labels computed for the main netlist for possible reuse in subsequent pattern matches.

2. The method of claim 1, wherein computing labels for both the main netlist and the pattern further includes,
    determining a vertex of the pattern;
    identifying the vertex depth appropriate for the pattern; and
    computing the labels for each of the vertices in both the main netlist and the pattern up to the vertex depth appropriate for the pattern, each of the computed labels identifying the topology information of the corresponding vertex.

3. The method of claim 2, wherein matching a vertex further includes,
    identifying one or more vertices in the main netlist whose labels match the computed label of the vertex of the pattern; and
    performing topology tracking to confirm matching of the pattern by matching vertices in the pattern with the corresponding vertices in the main netlist.

4. The method of claim 3, wherein performing topology tracking further includes,
    tracing the pattern from the vertex of the pattern to identify each of the vertices that define the topology of the pattern; and
    recursively matching the respective labels associated with the identified vertices of the pattern with the labels of corresponding vertices in the main netlist starting from the one or more vertices in the main netlist whose labels match the label of the vertex of the pattern.

5. The method of claim 1, wherein the computed labels for the matched vertices in the main netlist are stored in a netlist label database.

6. A non-transitory computer readable medium having program instructions which when executed by a computer performs pattern matching in a main netlist, the computer readable medium comprising:
    (a) program instructions for reading in the main netlist;
    (b) program instructions for reading in a pattern, the pattern used for finding matches in the main netlist, wherein the main netlist and the pattern include a plurality of vertices, each of the vertices being a net or a device;
    (c) program instructions for computing labels for each of the vertices in both the main netlist and the pattern up to a depth appropriate for the pattern, wherein the label for each of the vertices is computed through iterative relabeling to encode topology surrounding and including each of the vertices such that the vertices with matching topology are assigned a same label in both the pattern and the main netlist;

(d) program instructions for matching a vertex of the pattern with one or more vertices of the main netlist using the computed labels;

(e) program instructions for storing the computed labels including data related to depth for each of the vertices in the main netlist;

(f) program instructions for reading in a next pattern to be the pattern; and (g) program instructions for performing operations (c)-(e), wherein the matching of the next pattern is performed by determining a depth of the next pattern and reusing stored labels computed for the main netlist when the depth of the next pattern is less than or equal to the depth of the vertices in the main netlist for which computed labels are stored, and when the depth of the next pattern is greater than the depth of the vertices in the main netlist with computed labels each computing in (c) is for vertices in the main netlist for which labels have not yet been computed and each storing in (e) adds newly computed labels to stored labels computed for the main netlist for possible reuse in subsequent pattern matches.

7. The computer readable medium of claim 6, wherein program instructions for computing labels for both the main netlist and the pattern further includes, program instructions for determining a vertex of the pattern;

program instructions for identifying depth of the vertex appropriate for the pattern; and program instructions for computing the labels for each of the nodes in both the main netlist and the pattern up to the vertex depth appropriate for the pattern, each of the computed labels identifying the topology information of the corresponding vertex.

8. The computer readable medium of claim 7, wherein program instructions for matching a vertex further includes, program instructions for identifying one or more vertices in the main netlist whose labels match the computed label of the vertex of the pattern; and program instructions for performing topology tracking to confirm matching of the pattern by matching vertices in the pattern with the corresponding vertices in the main netlist.

9. The computer readable medium of claim 8, wherein program instructions for performing topology tracking further includes, program instructions for tracing the pattern from the vertex of the pattern to identify each of the vertices that define the topology of the pattern; and program instructions for recursively matching the respective labels associated with the identified vertices of the pattern with the labels of corresponding nodes in the main netlist starting from the one or more vertices in the main netlist whose labels match the label of the vertex of the pattern.

10. A system for matching a pattern in a main netlist, comprising:

a processor for executing program instructions;

a memory to provide program instructions execution support to the processor; and a pattern matching module to, a) retrieve data representation of the main netlist and the pattern including data associated with a plurality of vertices, wherein each of the vertices being a net or a device;

b) compute labels for each of the vertices in both the main netlist and the pattern up to a depth appropriate for the pattern, wherein the label for each of the vertices is computed through iterative relabeling to encode topology surrounding and including each of the vertices such that the vertices with matching topology are assigned a same label in both the pattern and the main netlist; and c) match a vertex of the pattern with one or more vertices of the main netlist using the computed labels, wherein the computed labels are stored for possible reuse in subsequent pattern matches;

d) store the computed labels including data related to depth for each of the vertices in the main netlist in the memory;

e) receive data representation of a next pattern as the pattern; and f) perform operations (b)-(d), wherein the match of the next pattern is performed by determining a depth of the next pattern and reusing stored labels computed for the main netlist when the depth of the next pattern is less than or equal to the depth of the vertices in the main netlist for which computed labels are stored, and when the depth of the next pattern is greater than the depth of the vertices in the main netlist with computed labels each computing in (b) is for vertices in the main netlist for which labels have not yet been computed and each storing in (d) adds newly computed labels to stored labels computed for the main netlist for possible reuse in subsequent pattern matches.

11. The system of claim 10, further includes a netlist label database for storing computed labels of each of the vertices in the main netlist.

\* \* \* \* \*

UNITED STATES PATENT AND TRADEMARK OFFICE
CERTIFICATE OF CORRECTION

| | | |
|---|---|---|
| PATENT NO. | : 8,788,990 B2 | Page 1 of 1 |
| APPLICATION NO. | : 12/604368 | |
| DATED | : July 22, 2014 | |
| INVENTOR(S) | : Meserve | |

It is certified that error appears in the above-identified patent and that said Letters Patent is hereby corrected as shown below:

In the Specification,

In column 2, line 67, delete "invention" and insert -- invention. --, therefor.

Signed and Sealed this
Twenty-fourth Day of February, 2015

Michelle K. Lee
*Deputy Director of the United States Patent and Trademark Office*